United States Patent [19]

Yan et al.

[11] Patent Number: 5,928,817
[45] Date of Patent: Jul. 27, 1999

[54] METHOD OF PROTECTING AN EUV MASK FROM DAMAGE AND CONTAMINATION

[75] Inventors: Pei-Yang Yan, Saratoga; Guojing Zhang, Sunnyvale, both of Calif.

[73] Assignee: Intel Corporation, Santa Clara, Calif.

[21] Appl. No.: 08/995,867

[22] Filed: Dec. 22, 1997

[51] Int. Cl.⁶ .................................................. G03F 9/00
[52] U.S. Cl. ................................................................ 430/5
[58] Field of Search ............................... 430/5, 311, 312, 430/313

[56] References Cited

U.S. PATENT DOCUMENTS 5,795,684  4/1996  Troccolo ..................................... 430/5

Primary Examiner—S. Rosasco
Attorney, Agent, or Firm—Naomi Obinata

[57] ABSTRACT

A novel mask for photolithography in semiconductor processing and the mask fabrication method is disclosed. The mask includes a substrate, a patterned buffer layer, a patterned absorber layer above the patterned buffer layer, and a protective cap. The substrate preferably contains a multi-layer resonant reflective surface. The buffer layer and protective cap are transmissive to the wavelength of light used in the photolithography. The absorber layer is absorptive to the wavelength of light used in the photolithography. The mask is fabricated by first depositing the buffer layer. The absorber layer is formed on the buffer layer. Both absorber layer and buffer layer are etched to create a pattern. A protective cap layer is then deposited on the patterned absorber layer and buffer layer, and the protective cap is planarized as needed to create a substantially smooth mask surface.

10 Claims, 2 Drawing Sheets

METHOD OF PROTECTING AN EUV MASK FROM DAMAGE AND CONTAMINATION

FIELD OF THE INVENTION

The present invention relates to maskmaking and is particularly useful in Extreme Ultraviolet Lithography ("EUVL") for manufacturing semiconductor integrated circuits. More specifically, the invention describes a way of making a mask to protect against damage and contamination that inevitably occurs during the mask fabrication process.

RELATED ART

Making photolithographic masks for semiconductor processing adopts methods similar to those used in the fabrication of semiconductor integrated circuits. The process begins with a mask substrate, usually made from quartz. The substrate is coated with an absorber layer, usually chromium. The absorber layer is then coated with photoresist. The photoresist is patterned using an electron beam or other patterning technique for creating fine patterns. The photoresist is then developed to open pattern areas to the absorber layer. The pattern is then transferred to the absorber layer using wet etch or plasma etching. The photoresist is removed. The resulting substrate contains a patterned absorber layer.

Traditionally, photolithography for patterning semiconductor circuits is performed using a mask and pellicle combination. A pellicle is used to protect the mask from falling particles to extend the lifetime of the mask. The traditional mask is usually very difficult to clean. The pellicle serves as a shield to prevent particles from reaching the mask. A pellicle is a flat, usually organic membrane substrate held by a frame, and placed over the mask.

Process defects are an inevitable part of creating a photolithographic mask. The step that creates the greatest defect issues is etching. The photoresist patterning may be defective, resulting in either an unwanted open area in the absorber or "micromasking", that is, photoresist or other contamination particles falling onto the areas to be etched and masking the area, resulting in an open area with a small unopened portion therewithin. In some areas particularly at pattern edges the photoresist may not be completely developed.

Because of the inevitable nature of process defects, repair techniques are used rather than try to create a completely defect-free process. After a substrate absorber layer is patterned, it is inspected for defects, and the defective areas are located. Then, a focused ion beam or other repair tool is used to "repair" the defect. This is done in several ways depending on the nature of the defect. If it is an unwanted open area in the absorber, the beam deposits additional absorber material into the open area to create a patch. If it is a micromasking or smaller pattern intrusion problem, then a gallium focused ion beam removes the excess material. In removing the excess material, the ion beam typically creates some damage to the underlying substrate, resulting in a gallium "stain".

As technology advances and semiconductor features continue to become smaller, newer methods of conducting photolithography must be used. One method of attaining down to 0.1 micron feature sizes is EUVL. In EUVL, a very small wavelength, on the order of 13 nanometers is used. Because of the particularly small feature sizes to be patterned, the mask for EUVL must also contain a very small pattern, on the order of 0.4 microns to create 0.1 micron semiconductor feature sizes, assuming a 4 times reduction. Defects have an amplifying effect as features get smaller. With features on a mask on the order of 0.4 microns, it becomes important to significantly improve the ways of dealing with defects.

One way of improving defect repair for EUVL that has been published is to use a buffer layer below the absorber. By using a polyimide material underneath the absorber layer, the polyimide can serve to absorb defects that occur during creation of the absorber layer pattern. An ion beam can be applied to the polyimide to repair the defects. Damage or stains are created in the polyimide from the repair. Then, the polyimide itself is etched down to the underlying substrate.

While the idea of using a buffer layer is useful, the published method has some shortcomings. Because the polyimide is organic, it typically does not etch as cleanly as other films may etch. The polyimide etch process itself would likely create defects, as in the case of the absorber layer etch. Although repair can be done after the polyimide etch, the EUVL mask substrate, being reflective, cannot accommodate remaining stains or damage in the manner of a traditional mask.

An additional limitation to EUVL is that the organic membrane pellicle described above cannot be used. This is because the organic membrane having a thickness greater than a few thousand angstroms is not transparent to EUVL wavelengths. For that matter, it is not currently known how to successfully create a useful pellicle that will be transparent to EUVL wavelengths. An alternative technique for protecting the mask surface is needed.

What is needed is an EUVL mask that can be created using a substantially defect-free process. What is also needed is a way to protect the mask surface to extend the mask lifetime of mask use in photolithography.

SUMMARY

A photolithography mask for fabricating semiconductor substrates is disclosed. The mask comprises a substrate having a surface that is reflective to the wavelength of light to be used in the photolithography, and a patterned buffer layer on the surface of the substrate. The buffer layer pattern creates openings in the buffer layer to expose portions of the substrate surface. An absorber layer is on the surface of the patterned buffer layer. The absorber layer has the same pattern as the patterned buffer layer. There is a planarized protective capping layer over the absorber layer. The capping layer is transmissive to the wavelength of light to be used in the photolithography.

DESCRIPTION OF THE PREFERRED EMBODIMENTS

The invention provides a solution to the problems of protecting the mask surface and fabricating the mask in such a way as to minimize the impact of defects. Fabrication is done using a buffer layer to absorb defects that inevitably occur during the step of patterning the absorber. The mask is protected by a cap that ensures a planar top surface. The invention is particularly useful for EUVL, that is, photolithography at a wavelength of about 5 to 25 nanometers. EUVL will be the context in describing the invention, although the invention can be used for other photolithography wavelengths requiring a mask created on a substrate.

Figure 1:
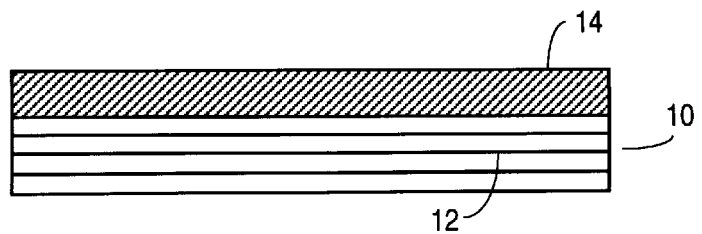
FIG. 1 is a cross-sectional view of an example of a starting mask substrate.

FIG. 1 is a cross-sectional view of a starting mask substrate 10 for EUVL. Mask substrate 10 preferably contains a multilayer resonant reflective structure 12. Resonant reflective structure 12 is preferably made of alternating thin sheets of silicon and molybdenum, each sheet being approximately 20 to 80 angstroms thick, with a total of approximately 20–100 individual sheets. Resonant reflective structure 12 is designed to create resonant reflectance for a given wavelength of light. Resonant reflective structure 12 is preferably formed on a very flat substrate (not shown), preferably a silicon wafer. Buffer layer 14 is formed directly on top of multilayer resonant reflective structure 12. Buffer layer 14 is made of a material that has the combined attributes of being an etch stop for an absorber layer, as well as capable of being plasma or wet etched in a substantially defect-free process. The preferred material for buffer layer 14 is silicon dioxide, formed to a minimum thickness to act as an etch stop and absorb defects from a repair step. Buffer layer 14 is preferably formed by sputtering, chemical vapor deposition or applying a liquid silicon dioxide formula and spinning onto substrate 10, so long as the method selected is substantially defect-free and forms a substantially flat buffer layer 14. The method of coating substrate 10 also must be of a sufficiently low temperature so as to avoid flowing or other movement of the underlying resonant reflective layer 12.

Figure 2:
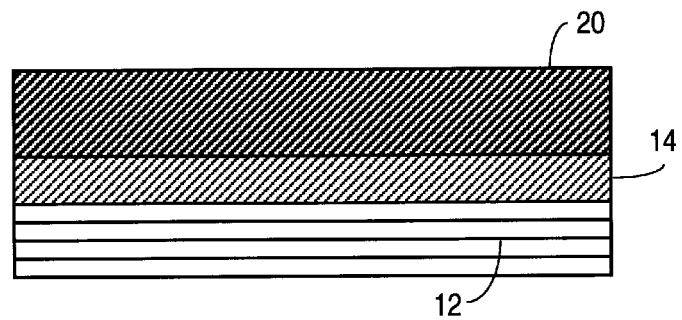
FIG. 2 is a cross-sectional view of an example of the starting mask substrate of FIG. 1 with a coating of buffer layer and absorber layer prior to patterning.

FIG. 2 is a cross-sectional view of the view of FIG. 1 with the addition of a 10 layer of absorber 20. Preferably, absorber layer 20 is a metal such as aluminum, tungsten or titanium, that is, a material that is substantially absorptive to the wavelength of photolithographic light to be used and having the characteristic of being etchable in a plasma. Absorber layer 20 is preferably formed by sputtering or chemical vapor deposition. The method used must be substantially defect-free and form a substantially flat absorber layer 20. The deposition method must also be of a sufficiently low temperature as to avoid flowing or other movement of underlying film structures. Absorber layer 20 is formed to a minimum thickness that can be plasma etched and repaired for defects, preferably approximately 400 angstroms to 2,000 angstroms thick. Following deposition of absorber layer 20, a layer of photoresist is applied (not shown) on absorber layer 20. Substrate 10 containing buffer layer 14, absorber layer 20 and photoresist (not shown) is placed in an electron beam write system to create a pattern in the photoresist in accordance with a preselected circuit pattern for a given pattern to be formed on a semiconductor wafer by photolithography. The photoresist is developed by rinsing in a developing solution, and a pattern is formed. The pattern created in the photoresist (not shown) is transferred to absorber layer 20 by plasma etching.

Figure 3:
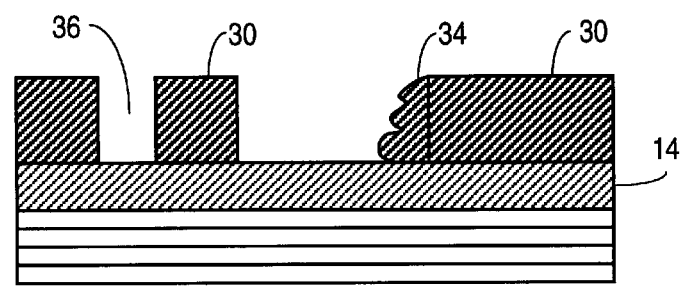
FIG. 3 is a cross-sectional view of an example of the mask substrate of FIG. 2 including a patterned absorber layer including defects.

FIG. 3 shows a cross-section of a patterned absorber layer 30 after plasma etching. Note that after plasma etching, the photoresist is removed, usually by wet etching or by plasma oxygen etching. Patterned absorber layer 30 was created using a plasma etch process that is selective to the underlying silicon dioxide buffer layer 14. As usually results from plasma etching a metal film, defects 34 and 36 are shown. Opaque intrusion defect 34 is usually caused by inadequate development of photoresist, creating a masking effect in an area that is intended to be opened. Clear intrusion defect 36 is usually caused by an overly developed area in the photoresist, resulting in punch-through of plasma to patterned absorber layer 30 during plasma etch patterning. Following plasma etching to create patterned absorber layer 30, a repair is done to remove the defects.

Figure 4:
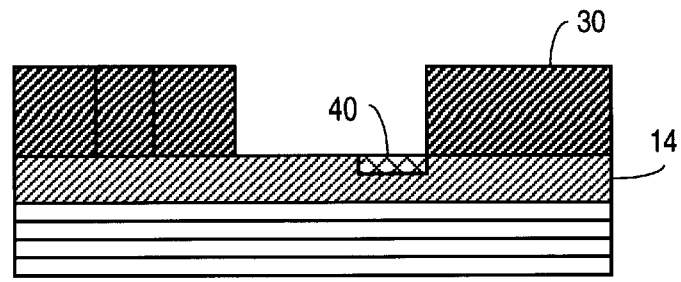
FIG. 4 is a cross-sectional view of an example of the mask substrate of FIG. 3 including a patterned absorber layer following defect repair.

FIG. 4 is a cross-sectional view of patterned absorber layer 30 over buffer layer 14 following the repair step. During repair, a gallium ion beam is preferably applied to defective areas 34 and 36 (of FIG. 3) to remove the defects and leave a cleanly opened, defect-free patterned absorber layer 30. Defect 34 needs to be removed; defect 36 needs to be filled. Due to the damaging nature of using an ion beam, a gallium stain 40 remains in buffer layer 14 where defect 34 was removed. For EUVL, after effects from ion beam repair, if remaining in resonant reflective layer 12, can create serious reflection problems when EUVL wavelengths light is applied to a finished mask. To avoid repair damage in resonant reflective layer 12, buffer layer 14 is incorporated in the mask fabrication to accommodate the defects arising from patterned absorber layer 30. By having buffer layer 14 accommodate the defects, then any defective portion of buffer layer 14 can be etched in a subsequent etching step. This is done by plasma etching buffer layer 14 itself to transfer the pattern of absorber layer 30 into buffer layer 14. Buffer layer 14 is plasma etched using a process which is substantially free of defects. Plasma etching of a silicon dioxide buffer layer 14 is generally substantially free of defects because the simultaneous ion bombardment and chemical etching that is needed for removing silicon dioxide tend to leave substantially clean, residue-free openings. Buffer layer 14 is etched completely through to the underlying resonant reflective layer 12.

Figure 5:
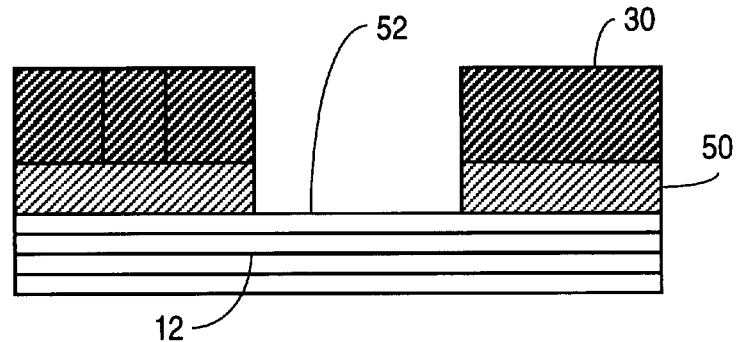
FIG. 5 is a cross-sectional view of an example of the mask substrate of FIG. 4 including a patterned absorber layer and patterned buffer layer.

FIG. 5 is a cross-sectional view of patterned absorber layer 30 which is now defect-free, with patterned buffer layer 50. Resonant reflective layer 12 is now exposed to light through open reflective area 52, so that when light at EUVL wavelength is applied, the light will reflect from open reflective area 52. The mask shown in FIG. 5 is now ready for the final, capping step.

Figure 6:
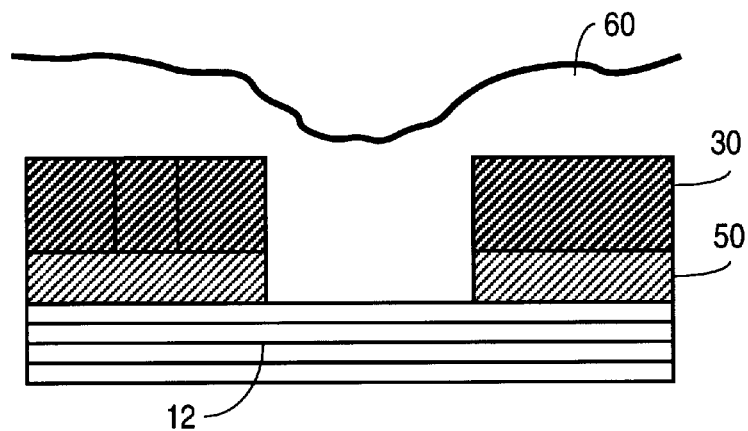
FIG. 6 is a cross-sectional view of an example of the mask substrate of FIG. 5 including a protective capping layer deposited over the patterned absorber layer and patterned buffer layer.

FIG. 6 is a cross-sectional view of patterned absorber layer 30 and patterned buffer layer 50 containing a freshly deposited capping material 60. Capping material 60 is preferably made from amorphous silicon for EUVL, for its EUVL transmissive characteristics, and is either sputtered or chemical vapor deposited onto patterned absorber layer 30. The capping material process must be selected to be of a sufficiently low temperature to avoid flowing or other movement of patterned absorber layer 30, patterned buffer layer 50 and resonant reflective layer 12. The capping material process also must be substantially defect-free, and preferably fills the open reflective area 52 completely with minimum voids. Capping material 60 is deposited in such a way that it overlies the top portions of patterned absorber layer 30 in a sufficient amount that it can be planarized to a predetermined thickness overlying the top surface of patterned absorbing layer during a subsequent step.

Figure 7:
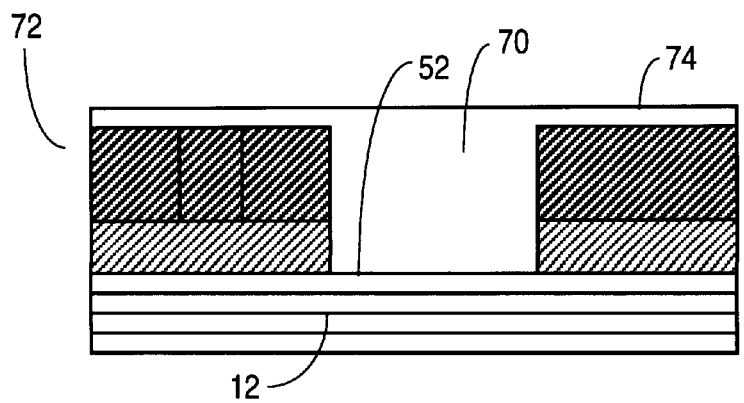
FIG. 7 is a cross-sectional view of an example of the mask substrate of FIG. 6 including a planarized protective capping layer, demonstrating the photo lithography mask of the invention in completed form.

FIG. 7 is a cross-sectional view of a planarized capping material 70 overlying patterned mask 72, to create the finished product. Planarized capping material 70 is created using chemical mechanical polish or plasma etchback to form a substantially smooth, top surface 74. The finished mask contains patterned absorber layer 30 to absorb applied light, and a reflective portion 52 to reflect light. Planarized capping material 70 transmits light to enable the light to reach reflective portion 52 and then reflect off of reflective portion 52. Planarized capping material 70 also forms a protective film over the entire surface of patterned mask 72. By having planarized capping material 70, then the top of the mask is protected. Even if particles fall onto the surface, the flat and planar finish to the mask enable the mask to be cleaned. Planarized capping material 70 forms the alternative solution presented by the pellicle, for extending the lifetime of a mask during use.

As described in the foregoing, the invention presents a solution to the combined issues of alleviating defects on the mask substrate, as well as extending the lifetime of the mask by forming a protective planar surface that can be cleaned. The invention is particularly useful for EUVL. While the invention has been described with reference to the structures disclosed herein, it is not confined to the details set forth; rather, the invention is defined by the scope of the following claims.

We claim:

1. A method of fabricating a photolithography mask, comprising the steps of:

providing a substrate;

forming on the surface of the substrate a buffer layer that can be etched in a substantially defect-free process;

forming on the surface of the buffer layer an absorber layer;

removing a section of the absorber layer, which exposes the buffer layer and creates defects in the absorber layer;

repairing defects in the absorber layer created by removing a section of the absorber layer; and removing the exposed buffer layer to expose the underlying substrate.

2. A method as in claim 1, wherein the substrate contains a resonant reflective surface.

3. A method as in claim 1, wherein the buffer layer is made of silicon dioxide.

4. A method as in claim 1, further comprising coating the surface of the substrate with a capping layer, the capping layer being transmissive to the wavelength of light to be used in the photolithography, and planarizing the capping layer.

5. A method as in claim 1, wherein the wavelength of light is approximately 5 to 25 nanometers.

6. A photolithography mask for fabricating semiconductor substrates, comprising:

a substrate having a surface that is reflective to the wavelength of light to be used in the photolithography;

a buffer layer made from a material that can be etched in a substantially defect-free process on the surface of the substrate covering only part of the substrate, thereby leaving uncovered portions of the substrate surface; and an absorber layer covering only the surface of the buffer layer and not otherwise covering the substrate surface.

7. A photolithography mask as in claim 6, wherein the substrate contains a resonant reflective surface.

8. A photolithography mask as in claim 6, wherein the buffer layer is made of silicon dioxide.

9. A photolithography mask as in claim 6, further comprising a planarized protective capping layer that covers the absorber layer, the capping layer being transmissive to the wavelength of light to be used in the photolithography.

10. A photolithography mask as in claim 9, wherein the wavelength of light is approximately 5 to 25 nanometers.

* * * * *

UNITED STATES PATENT AND TRADEMARK OFFICE
CERTIFICATE OF CORRECTION

PATENT NO.  : 5,928,817
DATED  : July 27, 1999
INVENTOR(S)  : Yan, et al.

It is certified that error appears in the above-identified patent and that said Letters Patent is hereby corrected as shown below:

In column 3 at line 3 delete "photo lithography" and insert -- photolithography --

In column 3 at line 44 delete "10"

In column 6 at line 13 delete "1" and insert -- 4 --

Signed and Sealed this

Seventh Day of March, 2000

Attest:

Attesting Officer

Q. TODD DICKINSON

Commissioner of Patents and Trademarks